United States Patent [19]

Hess

[11] Patent Number: 4,889,235

[45] Date of Patent: Dec. 26, 1989

[54] STACKING AND SURFACE PROTECTION DEVICE ON A PROTECTIVE HOUSING MADE OF A SYNTHETIC MATERIAL

[76] Inventor: Joachim Hess, Schroeplerstrasse 35, D-8070 Ingolstadt, Fed. Rep. of Germany

[21] Appl. No.: 152,048

[22] Filed: Feb. 4, 1988

[30] Foreign Application Priority Data

Feb. 10, 1987 [DE] Fed. Rep. of Germany ....... 3704016

[51] Int. Cl.$^4$ ............................................. B65D 21/02
[52] U.S. Cl. .................................. 206/511; 206/509; 220/71
[58] Field of Search ............... 206/503, 508, 509, 511; 220/4 B–4 E, 23.4, 23.6, 71

[56] References Cited

U.S. PATENT DOCUMENTS

| | | | |
|---|---|---|---|
| 3,346,137 | 10/1967 | Ricci | 206/511 |
| 3,635,350 | 1/1972 | Wolf | 220/23.4 |
| 4,413,737 | 11/1983 | Wind | 206/511 |
| 4,545,487 | 10/1985 | Asmus | 206/508 |

FOREIGN PATENT DOCUMENTS

| | | | |
|---|---|---|---|
| 3312176 | 10/1984 | Fed. Rep. of Germany | 206/509 |
| 1520253 | 2/1968 | France | 206/509 |
| 601194 | 4/1978 | U.S.S.R. | 206/508 |
| 987133 | 3/1965 | United Kingdom | 206/509 |

Primary Examiner—Jimmy G. Foster
Attorney, Agent, or Firm—Cort Flint

[57] ABSTRACT

A stacking and surface protection device is disclosed on a protective housing made of a synthetic material. The stacking and surface protection device has at least two raised supports in the form of supporting feet (14, 15) molded on each of the outer surfaces (10, 11, 12, 13). These supporting feet (14, 15) have contact surfaces made so that two supporting feet (14, 15) on an outer surface are male and female elements with respect to their contact surfaces and interlock when the outer surface is rotated by 180° around a vertical as well as a horizontal axis. As a result, protective housings stacked on top of each other, i.e. outer surfaces lying on top of each other are blocked in two degrees of freedom of the stacking plane. A stacking and surface protection device having stacking support surfaces of identical configuration by means of which stable stacks can be obtained while the smooth synthetic material surfaces are effectively protected against scratching and soiling is thereby created.

11 Claims, 3 Drawing Sheets

STACKING AND SURFACE PROTECTION DEVICE ON A PROTECTIVE HOUSING MADE OF A SYNTHETIC MATERIAL

BACKGROUND OF THE INVENTION

The instant invention relates to a stacking and surface protection device on a protective housing made of a synthetic material.

In chemical and refining plants, field instruments are generally built into protective housings made of a synthetic material in order to protect them from climatic influences and corrosive substances to ensure their proper operation and long tool life.

The outer surfaces of the protective housings are generally made to be as smooth as possible. The advantage of this over rough surfaces is that rain water runs off easily, that less dirt is deposited and that overall corrosion resistance is increased.

However, these advantages are also coupled with disadvantages that have been accepted until now. The smooth synthetic material surfaces are easily scratched during manufacture, warehousing, assembly, repair, etc., so that the aspect of the housings suffers. In the past, the housings were set down on a flat outer surface so that, in addition to the danger of scratching, the surfaces on which the housings are deposited are easily soiled, as in the case of repair, on a dirty or oily work bench.

Stackability of complete protective housings in the form of paralellepipeds is a special problem. It can easily be seen that until now only little friction is produced between two smooth contact surfaces in stacking, so that if the supporting surface is even slightly slanted, or if lateral forces are exerted, the stacked housings are shifted in relation to each other so that storage and transportation is impossible without using additional means. Until now, for instance, expensive support skeletons were used, together with welded foil packing, to prevent a stack from collapsing and to make transportation in a stacked condition possible at all.

Many different stacking and antislipping devices on housings are known. Known loud-speaker housings have supporting feet on their underside, near the corners, and are provided with corresponding depressions on their upper surface. When identical housings are stacked together into a so-called loud-speaker tower, the supporting feet enter into the depressions and act as antislipping devices. With such an arrangement the lower support surface with the supporting feet and the upper surface are fixed. If such a housing were to be set down upside-down, with the upper surface down, that surface would be scratched because of the missing protrusions.

Other stacking and antislipping devices consist of raised supports on both the lower and the upper surface. Here the "male" supports on the upper surface, located slightly further inside, reach into the "female" supports located further out. Slippage is thus prevented by common contact surfaces. But since the male or female supports are attached either on the lower or on the upper surface, these surfaces are necessarily different in configuration. When two surfaces of identical configuration are used, these can obviously not interlock by means of their antislipping devices.

However, known protective housings consist of two or more bottom and cover elements. These elements are of different depths, and by using different combinations they can be put together into more or less deep protective cases, depending upon the application. This means, for instance, that when identical cover elements of equal depth are assembled, the bottom and the cover surfaces are identical in configuration. Depending upon the application, a deep or flat protection case element can also be used as a bottom or cover element, so that one and the other surface alternately becomes the bottom or the cover surface.

Due to this fact it is not possible to use the above-described, known stacking and antislipping devices which would require a fixed designation of the bottom or cover surface and different configurations.

Accordingly, an object of the instant invention is to create a stacking and surface protection device on a protective housing made of a synthetic material that simply and inexpensively serves as a protector of delicate smooth surfaces, furthermore makes stable stacking possible and prevents mutual shifting of two protective housings stacked on top of each other while the surfaces are of identical configuration.

SUMMARY OF THE INVENTION

The above objectives are accomplished according to the invention by providing at least two raised supports in the form of supporting feet molded in an identical manner on a protective housing at the same distance to each other having at least two parallel outer surfaces facing each other. The contact surfaces of the supports are of such configuration that the two supports are male and female elements on one outer surface, from the standpoint of their contact surfaces. When the outer surface, i.e. a protective housing, is rotated by 180° around a vertical or horizontal axis in relation to a protective housing below, protective housings stacked on top of each other interlock through the contact surfaces of the supports and antislipping safety is provided through the fact that two degrees of freedom in the stacking plane are blocked.

These characteristics makes it possible to obtain surface protection in every instance by means of the raised supports in the form of supporting feet, whether or not one or the other outer surface sits on the floor, on a work bench, etc. At the same time reliable stacking and anti-slipping is ensured with supports of identical design and location, i.e. with identical configuration of the outer surfaces.

Two supports are suitable for secure stacking only if the supports themselves are relatively large enough. With smaller supports the stacked housing could easily tip over the connecting line of the supports. This can be prevented by providing additional supporting feet. These would no longer have to serve as antislipping devices, i.e. they would no longer have to have interlocking contact surfaces.

The supports and possibly additional supporting feet are preferably of equal height so that a stack is built up straight and vertically upwards without tipping over and so that individual housings can be set down evenly on supports.

The arrangement according to the invention is especially advantageous with protective housing designs where different, standardized housing bottom elements or cover elements of different depths can be assembled into protective housings of varying sizes, Intermediary elements may be used without losing stackability by means of the antislipping devices. All that is necessary is that each bottom surface of the housing to be stacked must be rotated in relation to the top surface of the housing below so that the corresponding supports interlock.

Four supports, preferably near the corners of the outer surfaces, may be used with the contact surfaces of the four supports defining a rectangle. Two supports diagonally across from each other have alternately inner or outer contact surfaces in relation to the rectangle. By using four supports a secure position is achieved. Furthermore, the protective housing or housing elements are reinforced especially near the corners and the stacking load is advantageously transmitted downward directly to the vertical lateral surfaces, so that the horizontal walls are not subjected to great loads.

The supports or their contact surfaces may have different profiles of angular, corrugated or circular shape, or have a combination of such profiles. It is only necessary to ensure that mutual blockage of the stacked elements in the two degrees of freedom of the stacking surface takes place.

The design of the supports in form of elbows has proven especially advantageous as it provides for good support and reinforcement of the area near the corners and for simplicity in manufacture and easy removal from the mold.

Also especially advantageous is an the inclined configuration of the contact surfaces according to claim 7. On the one hand this provides inclines to facilitate removal from the mold and on the other hand the inclines provide a good pitch and contact surfaces in stacking.

The supports may be positioned symmetrically in relation to a central axis of the outer surface of the housing. This has the advantage that the lateral surfaces of a stack lie one above the other.

DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
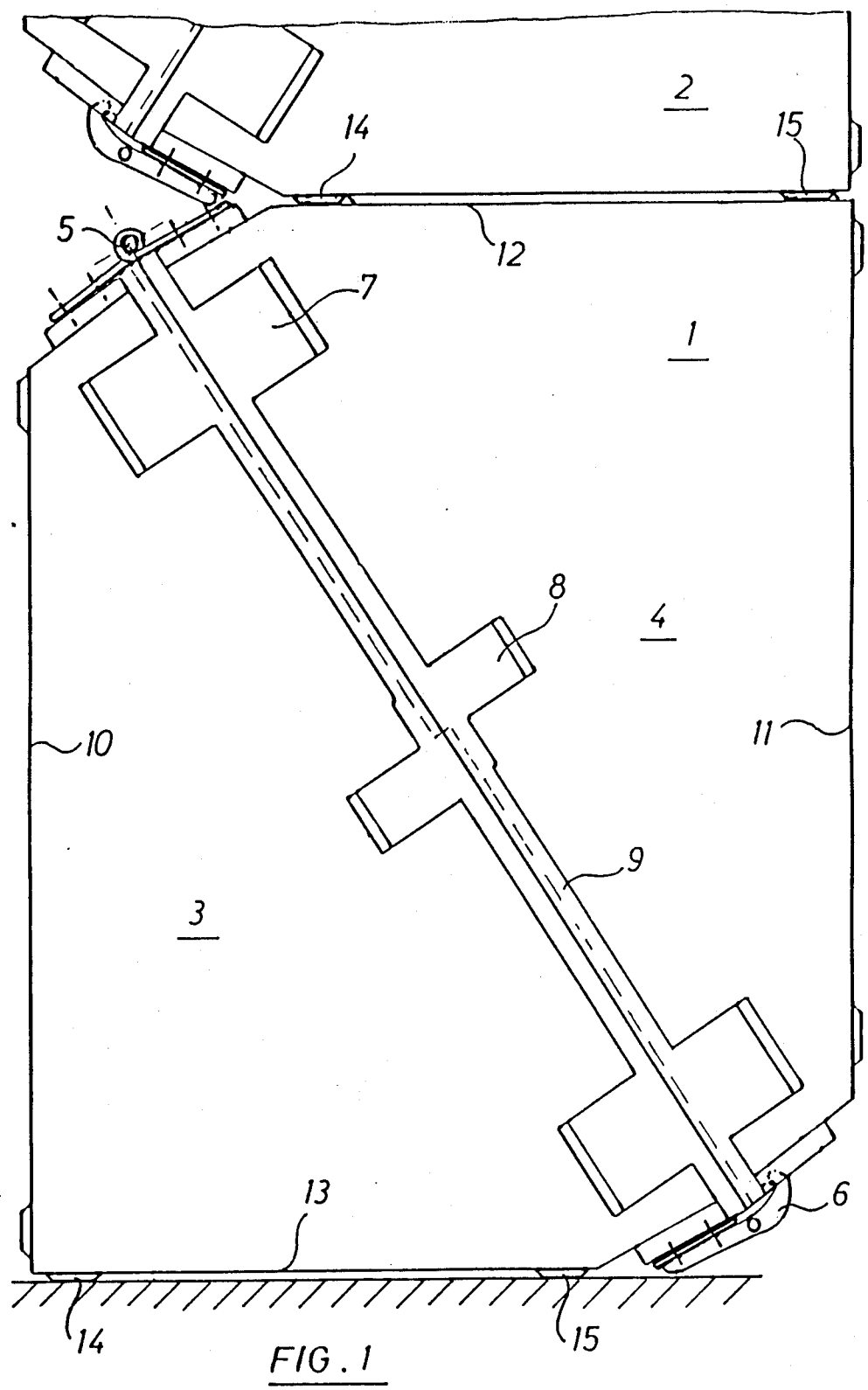
FIG. 1 is a side view of two stacked protective housing.

FIG. 1 shows a protective housing 1 made of a synthetic material with an identical protective housing 2 stacked on top of it and rotated by 180° around the vertical, of which only the lower portion is shown.

The protective housing 1 consists of two identical housing elements 3, 4 which are made in the form of a roof and are juxtaposed along a diagonal plane 4 to constitute the protective housing 1. The housing elements 3, 4 are held together by means of an upper hinge 5 and a lower quick-release lock 6 so that they can be opened. Material reinforcements 7, 8 as well as a juxtaposition rim 9 serve in stacking the individual housing elements on top of each other and are locations free to receive hardware for universal applications of the protective housing 1, also constituting reinforcement ribs to impart stability to the housing. Supporting feet 14, 15 are integrally attached to the two lateral surfaces 10, 11 as well as on the upper surface 12 and on the lower surface 13.

Figure 2A:
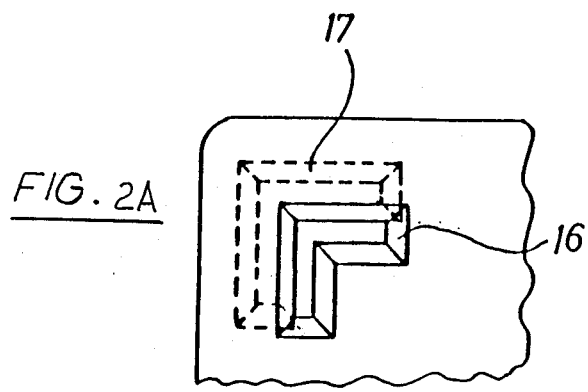
FIGS. 2 and 2A are side views and top views, respectively, of angled supporting feet near the corners of contact surfaces.
Figure 2:
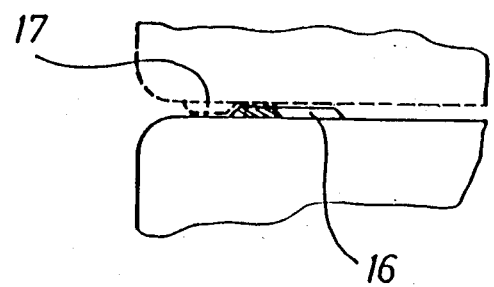

The protective housing 1 stands on the ground on the lower supporting feet 14, 15. It can be seen here that as a result the outer surface 13 no longer rests directly on the floor and is thus protected against scratching and soiling. Equal protection is also achieved if the protective housing 1 rests on the floor on the other sides 10, 11, 12 or rests on a different support, e.g. on a work bench. To constitute a stable stack, the corresponding supporting feet 14, 15 of the upper, stacked protective housing 2 interlock with the upper supporting feet of the lower protective housing 1. The exact design of the supporting feet 14, 15 can best be seen in FIG. 2. The supporting feet 14, 15 are in the form of elbows 16, 17. The cross-section of the arms of the elbows being trapezoidal. Two by two, the elbows on one surface are offset by the width of an elbow arm towards the middle, so that the offset position of the elbows 16, 17 as shown in FIGS. 2,2A results in a stack, constituting an antislipping device. The inclined trapezoidal surfaces of the elbows 16, 17 are needed to remove the piece from the mold and at the same time constitute good pitch in stacking.

Figure 3:
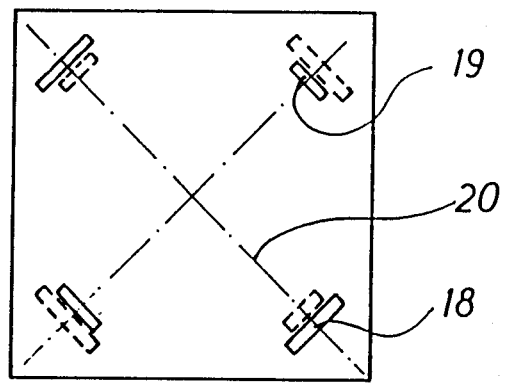
FIG. 3 is a top view of a contact surface with straight supporting feet.
Figure 4:
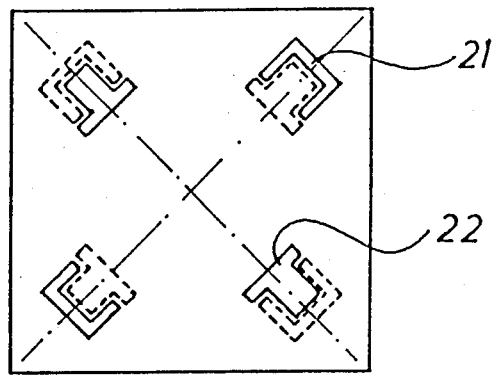
FIG. 4 is a top view of a support surface with U-shaped and T-shaped supporting feet.

FIG. 3 shows an embodiment of supporting feet 18, 19 in the form of straight blocks positioned at a right angle to the diagonals 20 of the support surface. The supporting feet of the opposite surface, rotated by 180°, are shown in broken lines so that the mutual support can be visualized FIG. 4 shows a similar arrangement with a U-shaped design of supporting feet 21 and the corresponding T-shaped supporting feet 22, which also interlock.

Figure 5:
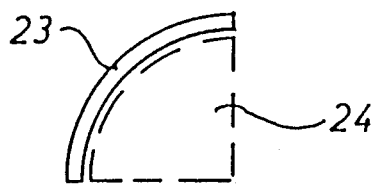
FIG. 5 shows an embodiment of a supporting foot in the form of a semi-circle.

FIG. 5 shows a supporting foot 23 in the shape of a quarter circle, with its corresponding opposite piece 24. The contact surfaces can obviously be either concave or convex, and can also be closed into a circle.

Figure 6:
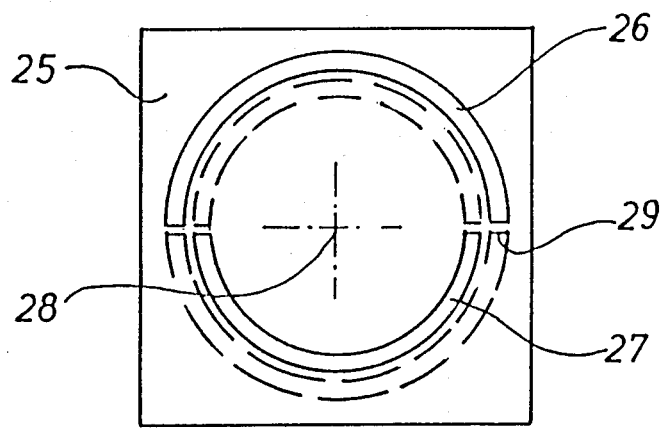
FIG. 6 shows an antislipping device consisting of two semi-circles that can be offset in relation to each other.

FIG. 6 shows the outer surface 25 of a housing, with a first support 26 in form of a semi-circle offset in relation to a second support 27 to the inside so that the semi-circle 26 constitutes a contact surface on the inside, and the semi-circle 27 constitutes a contact surface on the outside. Although both semi-circles 26, 27 are provided as the sole support elements and are not symmetric with'in relation to the middle vertical 28, stacked housings (see broken lines) cannot be twisted around in relation to each other because the end surfaces 29 of two corresponding semi-circles block each other.

In conclusion it can be seen that the instant invention creates a stacking and surface protection device on a protective housing with stacking contact surfaces of identical configuration by means of which stable stacks can be obtained while the smooth synthetic material surfaces are effectively protected against scratching and soiling.

While a preferred embodiment of the invention has been described using specific terms, such description is for illustrative purposes only, and it is to be understood that changes and variations may be made without departing from the spirit or scope of the following claims.

What is claimed is:

1. A stacking and surface protection device on a protective housing made of a synthetic material of the type having at least two parallel opposing outer surfaces, wherein the improvement comprises:

four raised supports carried adjacent the corners on each of said outer surfaces which serve as supporting feet, said raised supports forming a rectangle in such a manner that two diagonally opposed raised supports constitute alternate outer and inner contact surfaces with respect to the rectangle, contact surfaces formed on said raised supports in such a manner that interlocking pairs consisting of two raised supports on opposite ones of said outer surfaces of stacked housings are defined which constitute first and second elements when two of said housings are stacked, and said first and second elements interlocking when a rotation of 180 degrees takes place around a vertical or a horizontal axis to lock superposed contact surfaces of said housings together in two degrees of freedom of the stacking plane serving as antislipping devices.

2. The device of claim 1 wherein said supports are of same height.

3. The device of claim 1 wherein said opposite outer surfaces are the bottom surface of one housing and the cover surface of another housing each consisting of at least two elements.

4. The device claim 1 wherein said raised supports and said corresponding contact surfaces are straight.

5. The device claim 1 wherein said raised supports and said corresponding contact surfaces are angled.

6. The device claim 1 wherein said contact surfaces are circular.

7. The device claim 1 wherein said raised supports and corresponding contact surfaces are U-shaped.

8. The device claim 1 wherein said supports and corresponding contact surfaces are T-shaped.

9. The device of claims 1 wherein said supports are formed as elbows having arms which define a right angle, and each elbow is diagonally offset by the width of an elbow arm with respect to the other.

10. The device of claims 1 wherein said contact surfaces are inclined.

11. The device of claims 1 wherein said supports are positioned symmetrically in relation to a central axis of the outside housing surface.

* * * * *